US007794554B2

(12) United States Patent
Aimone et al.

(10) Patent No.: US 7,794,554 B2
(45) Date of Patent: Sep. 14, 2010

(54) REJUVENATION OF REFRACTORY METAL PRODUCTS

(75) Inventors: Paul R. Aimone, Bridgewater, MA (US); Prabhat Kumar, Framingham, MA (US); Peter R. Jepson, Newbury, MA (US); Henning Uhlenhut, Jena (DE); Howard V. Goldberg, Framingham, MA (US); Steven A. Miller, Canton, MA (US)

(73) Assignee: H.C. Starck Inc., Newton, MA (US)

( * ) Notice: Subject to any disclaimer, the term of this patent is extended or adjusted under 35 U.S.C. 154(b) by 262 days.

(21) Appl. No.: 11/038,890

(22) Filed: Jan. 19, 2005

(65) Prior Publication Data

US 2006/0032735 A1       Feb. 16, 2006

Related U.S. Application Data

(63) Continuation-in-part of application No. 10/075,709, filed on Feb. 14, 2002, now abandoned.

(60) Provisional application No. 60/268,742, filed on Feb. 14, 2001.

(51) Int. Cl.
    *C21D 5/00*    (2006.01)
(52) U.S. Cl. .................. 148/512; 148/668; 148/714; 419/30; 419/1; 419/61; 204/192.1; 204/298.12; 204/192.12
(58) Field of Classification Search .................. 148/512
    See application file for complete search history.

(56) References Cited

U.S. PATENT DOCUMENTS 6,046,426 A * 4/2000 Jeantette et al. ........ 219/121.63

FOREIGN PATENT DOCUMENTS

| DE | 19626732 A1 | 1/1998 |
|----|-------------|--------|
| DE | 19925330 | 12/2000 |
| EP | 0834594 A1 | 4/1998 |
| JP | 60215761 A * | 10/1985 |
| WO | 00/31310 | 6/2000 |
| WO | WO 03062491 A2 * | 7/2003 |

OTHER PUBLICATIONS

P.A. Vetter, Th. Engel and J. Fontaine, "Laser cladding: the relevant parameters for process control," Proceedings of the SPIE, vol. 2207 pp. 452-462 (1994).*
Abbott D H et al: "Laser Forming Titanium Components" Advance Materials & Processes, America Society for Metals. Metals Park, Ohio, US, vol. 153, No. 5, May 1998, pp. 29-30.
Arcella F G et al: "Producing Titanium Aerospace Components from Powder Using Laser Forming" JOM, Minerals, Metals and Materials Society, Warrendale, US, vol. 52, No. 5, May 2000, pp. 28-30, XP001157479.

* cited by examiner

*Primary Examiner*—Roy King
*Assistant Examiner*—Christopher Kessler
(74) *Attorney, Agent, or Firm*—Connolly Bove Lodge & Hutz LLP

(57) ABSTRACT

Refractory metal products, such as tantalum, can be rejuvenated after metal consumption in selected zones by filling the zones with powder and simultaneously applying focused radiant energy to the powder.

16 Claims, 2 Drawing Sheets

REJUVENATION OF REFRACTORY METAL PRODUCTS

CROSS REFERENCE TO RELATED APPLICATIONS

This application is a continuation-in-part application of U.S. application Ser. No. 10/075,709, filed on Feb. 14, 2002, now abandoned which in turn claimed priority of Provisional Application No. 60/268,742, entitled "REJUVENATION OF SPUTTERING TARGETS" filed on Feb. 14, 2001, and which is incorporated herein by reference.

BACKGROUND OF THE INVENTION

The purpose of the invention is to decrease the recycling cost of refractory metal products, and, in particular, to rejuvenate sputtering targets having backing plate structures attached.

Sputtering targets of high temperature materials, such as tantalum and other refractory metals used in integrated circuit manufacture and other electrical, magnetic and optical product manufacture usually are eroded in a non-uniform way during the process of sputtering which leads to a race track like trench on the operating side of the target. In order to prevent any contamination of the substrates or catastrophic break-through of coolant fluids behind the target, the targets generally are withdrawn from service well before the refractory sputter metal is penetrated, accepting the need for a new target after only a minor portion (typically from 25 to 35% of the target depending on the target design) of the sputter metal has been consumed. The major part of the sputter target can be resold only at scrap price or recycled with difficulty. In addition, the backing plate of the target must be removed and may be re-bonded to a new sputter metal plate for recycling.

Published German application 19,925,330 suggests a process for recycling sputtering targets wherein the target material is poured in pieces or as liquefied material to the consumed portions of the target. Thereafter, thermal energy (provided via infrared radiation) is introduced in the direction of the target. The target material is completely melted and allowed to solidify. Finally, published European patent application 834,594 suggests that sputtering targets can be recycled after use by adding a refractory metal powder to the consumed portions of the target and pressing the powder under heat and pressure.

It is a principal object of the invention to replace current recycling processes by the rejuvenation of the refractory metal product (preferably a sputtering target). It is also an object of the invention to improve the cost and speed of getting used sputtering targets back into service. Finally, it is a further object of the invention to establish a microstructure of the fill zone at least as good as on the balance of the target.

DESCRIPTION OF THE INVENTION

Figure 1:
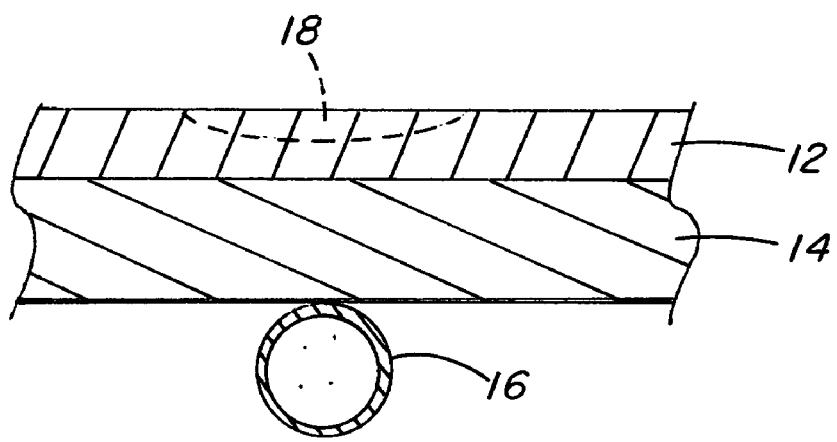
FIG. 1 shows a cross section of typical target and backing plate.

The present invention is directed to a method to rejuvenate surfaces of used refractory metal products by filling consumed surface areas with consolidated powder metal. More particularly, the present invention is directed to a process for rejuvenating a refractory metal product (and preferably a sputtering target) having one or more consumed surface area portions comprising the steps of:

a) filling (preferably continuously) the consumed portions with refractory metal powder particles having the same composition as the refractory metal product, b) simultaneously applying focused radiant energy to the powder in order to melt the powder, thereby causing particle to particle bonding and bonding of the particles to the consumed portions of the refractory metal product, c) discontinuing the filling step a) and the radiant energy applying step b) once the consumed portions have been completely filled, and d) profiling the filled portions to the desired final shape.

By filling (and preferably continuously filling) the consumed portions with refractory metal powder particles having the same composition as the refractory metal product and simultaneously applying focused radiant energy to the powder, the following advantages are attained: i) complete melting of the metal powder, ii) controlled solidification, iii) a pore free interface between the added metal and the original refractory material, iv) epitaxial growth on the substrate and v) a fine and uniform microstructure.

The invention can be applied to refractory metal products generally (whether or not mounted on a nonrefractory metal carrier) that are subject to non-uniform erosion, etching, chipping or other metal loss. The form of such refractory metal products can be as plate, rod, cylinder, block or other forms apart from sputter targets. The process can be applied to, for example, x-ray disks or targets (molybdenum plate on carbon backing). The process can be used with products made of substantially any refractory metal. Suitable refractory metals include tantalum; niobium; molybdenum; titanium; zirconium; alloys of such metals; and, hydrides, and nitrides of such metals. Tantalum, niobium, molybdenum and alloys thereof are preferred with tantalum being the most preferred refractory metal.

The rejuvenation of a refractory metal product (e.g., a tantalum target) eliminates the need to recycle the whole product after only a minor portion of the product has been consumed. The rejuvenation can be more economical than recycling the whole target. If the product includes a bonded backing plate (e.g., copper), separation of the backing plate may not be necessary. The rejuvenation process can be practiced repeatedly.

The process of the present invention requires the step of filling the consumed portions of a refractory metal product with a refractory metal powder having the same composition as the refractory metal product. Suitable devices for spraying refractory metal powders are known in the art. Generally, such devices utilize an inert gas stream to transport the powder to a nozzle from which the powder is sprayed. Known devices of this type include the Northwest Mettech MPF feeder and the Sulzer Metco 9MP and 9P-CL feeders.

The key to the present invention is to melt the refractory metal powder as it contacts the material to be rejuvenated so that the powder sticks, flows and is dense. It has been found that if a powder is first deposited and then melted, a porous surface results. In order to melt the refractory metal powder as it contacts the material to be rejuvenated, focused radiant energy is applied to the powder as it fills the consumed portions of the refractory metal product. Suitable sources of focused radiant energy include lasers, electron beams and plasma discharge devices. Useful laser devices are known and include gas lasers such as 15 to 20 KW $CO_2$ lasers and 1 to 3 KW Nd:YAG lasers (neodymium:yttrium aluminum garnet); solid-state lasers; and semiconductor lasers. The operation may be continuous or pulsed. Details of useful lasers and their mode of operation can be found in the Encyclopedia of Chemical Technology, Kirk-Othmer, Fourth Edition, 1995, Volume 15, pages 1 through 50. Generally, the more powerful lasers (e.g., 15 to 20 KW) produce a large (i.e., 3-5 mm) grain size which may not be desirable. The less powerful lasers (e.g., 1-3 KW) produce a 200 to 500 micron grain size. Of course, processing with a less powerful laser may take longer and thus may lead to an increase in repair costs. Electron beam and plasma discharge devices are generally not preferred since neither provides a full dense structure.

In the case of sputtering targets, the process of the invention may avoid the necessity of removing the backing plate from the target depending upon the temperatures generated by the energy source. If the temperature is too high, the process could result in the melting of the backing plate. Furthermore, in order to avoid warping of the backing plate due to the localized nature of the heat applied, it may be necessary to uniformly preheat the target and backing. Of course, the questions of melting or warping of the backing plate is dependent upon the backing plate material and the method used to bond it to the target. The various forms of rejuvenation produce a filled erosion zone that may have a microstructure similar to the balance of the target.

Figure 2:
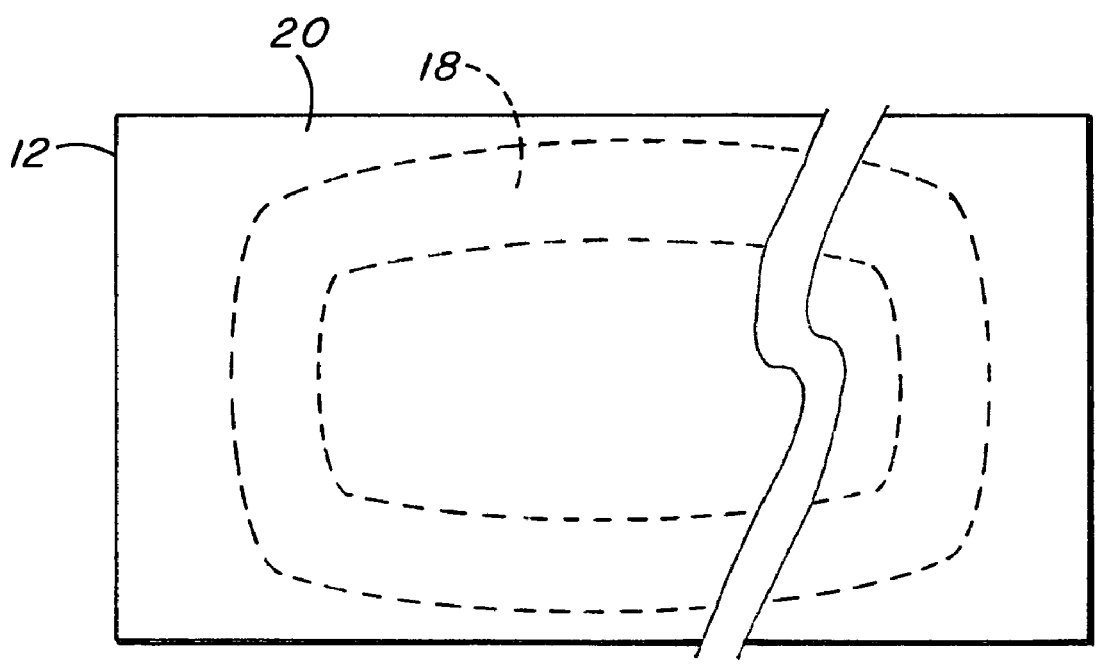
FIG. 2 shows a face view including a usual erosion zone.

Now turning to FIGS. 1 and 2, a tantalum (Ta) sputter plate 12 bonded to a copper (Cu) backing plate 14 is presented to illustrate the rejuvenation process of the present invention. In addition to the backing plate, the sputter target may include additional complexity such as bonded-on water cooling coils 16 or even be part of a large cooling liquid reservoir and/or have complex flanges and mechanical and electrical attaching structures. 18 indicates a typical racetrack form erosion zone or consumed area on the target surface 20 of the sputter plate 12 arising from sputtering usage.

Figure 3:
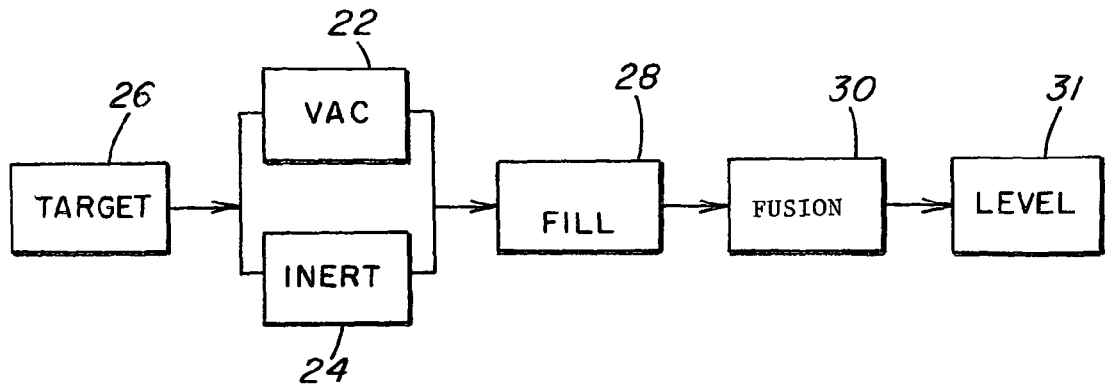
FIG. 3 is a block diagram of the rejuvenation process.

A flow chart of the implementation of the preferred embodiment of the present invention is illustrated in FIG. 3. Depending upon the type of focused radiant energy chosen, either a vacuum 22 (e.g., in the cases of an electron beam device) or an gas zone 24 (e.g., in the case of a laser) is established for the used target assembly 26. The erosion zone 18 or consumed area of the sputter plate 12 (as shown in FIG. 2), is filled, 28, with a refractory metal powder having the same composition as the target. Simultaneously, focused radiant energy is applied to the powder at 30 to fuse the powder. The melting/fusing is done as the powder contacts the surface of the target. Once the consumer portion has been filled, the filling and radiant energy application are stopped. The filled portion is then profiled to the desired shape by machining, sanding or other abrading technique, etching and/or a burn-in sputtering process.

Figure 4:
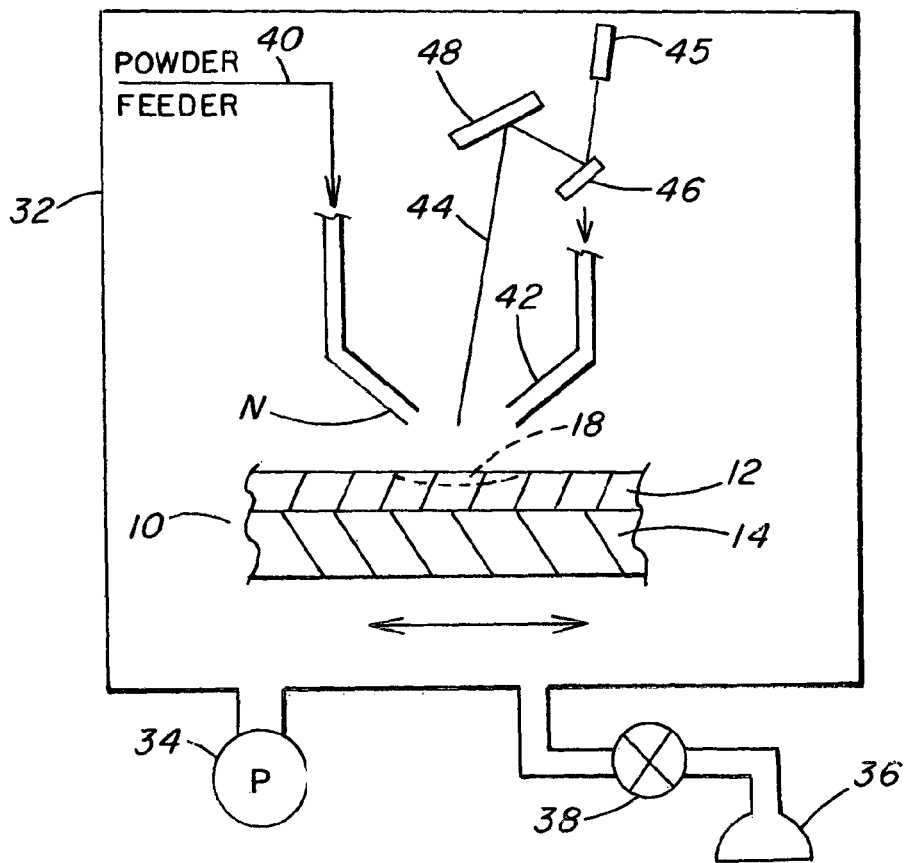
FIG. 4 shows in outline form a vacuum or inert gas chamber set-up for practice of the invention.

In FIG. 4, a sputtering target 10 can be placed in a vacuum chamber 32, that is evacuated and then backfilled to less than, equal to or greater than atmospheric pressure with purified inert gas (e.g., argon) atmosphere utilizing a conventional pump 34 and gas back-fill apparatus 36 with valve 38. A powder feeder 40 comprising multiple nozzles 42 can insert multiple high velocity streams of carrier gas and Ta powder of −100 to 325 mesh to the erosion zone 18 or consumed area. The powder feeder 40 can scan along the erosion zone 18 or the target can be moved relative to a fixed powder feeder. A laser beam 44 formed by a laser 45 and conventional scan optics 46, 48 which can be wholly in the chamber 32 or partly outside the chamber 32 using a window for beam passage can be traced in raster scan fashion over the erosion zone 18, as the powder falls, to melt powder particles and enable particle to particle bonding and bonding to the base of the erosion zone continuously and repeatedly around the zone 18 until it is filled. Powder mass calculations and/or optical monitors can be used to determine completion and a cut-off of filling and radiant energy application.

One form of equipment usable for such processing is the Lasform brand direct metal deposition system of AeroMet Corp., as described, e.g., in Abbott et al., "Laser Forming Titanium Components" in the May 1998 issue of Advanced Metals & Processes and Arcella et al., "Producing Titanium Aerospace Components From Powder Using Laser Forming," Journal of Metals (May 2000), pp. 28-30. Useful devices are also manufactured by Optomec, Inc. and are described at the manufacturer's website [http://www.optomec.com/html/lens.htm].

The laser can provide post-fill heating to complete the fusing. Separate target heaters can be used to preheat the target or provide additional heat during the rejuvenation.

The various forms of rejuvenation can produce a filled erosion zone or consumed area with microstructure similar to the balance of the target. For example, filled erosion zone specimens from a sputtering target were analyzed by the electron beam raster scanning method. The hardness was typical for rolled and annealed tantalum plate with normal variation. The filled erosion zones were substantially free of porosity and inclusions. The yield strength and ultimate yield strength met ASTM requirements.

In another embodiment of the invention, the well known process of plasma deposition can be utilized to combine the powder placement and fusing steps.

The example that follows is intended to illustrate the invention without restricting its scope.

EXAMPLE 1

Rejuvenation was performed using a Trumph 3 KW Nd:YAG laser attached to a Fanuc M16i Robot. The entire assembly was contained in a stainless steel inert gas chamber with airlocks to prevent ingress of oxygen during part change-out. Process control was established using a CID camera to monitor the molten pool at the laser beam-powder-surface interface. Build quality was monitored using a conventional CCD camera. Two tantalum sputtering targets were fabricated by laser deposition of Ta powder on a tantalum substrate. The substrate was used to simulate a spent tantalum target. The deposits, approximately 105 mm in diameter and 5 mm thick, were made using an Nd:YAG laser operating at 2 KW and a powder flow rate of 1.9 $mm^3/s$. The tantalum powder stream and laser beam were cofocused, simultaneously applied and moved continuously such that layers of the fused and melted powder were built up to fill the void on the substrate and form a solid deposit. Once the void was filled and the deposit was of the desired size the powder stream was discontinued and the laser beam (radiant energy) was turned off Subsequent to fabrication, one target was machined (the surface was leveled by a single point turning the laser deposit in a lathe.) to 102 mm diameter by 6.35 mm thick and sputter deposited to determine the uniformity of the film produced. The second target was sectioned and evaluated for chemistry Results of the chemical analysis by glow mass discharge for two laser deposits and the starting powder were as shown in Table 1.

TABLE 1

| Element | Laser Deposit [ppm wt] | Laser Deposit [ppm wt] | Starting Powder [ppm wt] |
|---|---|---|---|
| Li | <0.001 | <0.001 | <0.002 |
| Be | <0.001 | <0.001 | <0.001 |
| B | 0.01 | <0.005 | <0.01 |
| F | <0.05 | <0.05 | <0.31 |
| Na | <0.005 | <0.005 | 1.8 |
| Mg | 1.5 | 1.1 | 48 |
| Al | 0.15 | 0.15 | 0.34 |
| Si | 0.65 | 0.35 | 0.83 |
| P | 0.03 | 0.03 | 0.03 |
| S | 0.05 | 0.03 | 0.17 |
| Cl | <0.01 | <0.01 | 0.59 |
| K | <0.01 | <0.01 | 0.08 |
| Ca | <0.01 | <0.01 | 0.03 |
| Sc | <0.001 | <0.001 | <0.001 |
| Ti | 1.5 | 1.7 | 0.1 |
| V | 0.09 | 0.11 | 0.008 |
| Cr | 2.3 | 2.5 | 5.4 |
| Mn | 0.05 | 0.03 | 0.41 |
| Fe | 5.5 | 6.3 | 11 |
| Co | 0.11 | 0.33 | 0.02 |
| Ni | 3.1 | 2.1 | 0.6 |
| Ag | <0.005 | <0.005 | <0.005 |
| Cd | <0.01 | <0.01 | <0.01 |
| In | <0.005 | <0.005 | <0.005 |
| Sn | <0.05 | <0.05 | <0.05 |
| Sb | <0.01 | <0.01 | <0.01 |
| Te | <0.01 | <0.01 | <0.01 |
| I | <0.01 | <0.01 | <0.01 |
| Cs | <0.005 | <0.005 | <0.005 |
| Ba | <0.005 | <0.005 | <0.005 |
| La | <0.005 | <0.005 | <0.005 |
| Ce | <0.005 | <0.005 | <0.005 |
| Pr | <0.005 | <0.005 | <0.005 |
| Nd | <0.005 | <0.005 | <0.005 |
| Sm | <0.005 | <0.005 | <0.005 |
| Eu | <0.005 | <0.005 | <0.005 |
| Gd | <0.005 | <0.005 | <0.005 |
| Tb | <0.005 | <0.005 | <0.005 |
| Dy | <0.005 | <0.005 | <0.005 |
| Ho | <0.005 | <0.005 | <0.005 |
| Er | <0.005 | <0.005 | <0.005 |
| Tm | <0.005 | <0.005 | <0.005 |
| Cu | 0.11 | 0.05 | 0.22 |
| Zn | <0.01 | <0.01 | 0.38 |
| Ga | <0.01 | <0.01 | <0.01 |
| Ge | <0.01 | <0.01 | <0.01 |
| As | <0.005 | <0.005 | <0.005 |
| Se | <0.01 | <0.01 | <0.01 |
| Br | <0.01 | <0.01 | <0.01 |
| Rb | <0.005 | <0.005 | <0.005 |
| Sr | <0.005 | <0.005 | <0.005 |
| Y | 0.002 | 0.002 | 0.001 |
| Zr | <0.01 | <0.01 | 0.02 |
| Nb | 2.9 | 1.7 | 0.75 |
| Mo | 0.73 | 0.73 | 0.75 |
| Ru | <0.01 | <0.01 | <0.01 |
| Rh | <0.005 | <0.005 | <0.005 |
| Pd | <0.005 | <0.005 | <0.005 |
| Yb | <0.005 | <0.005 | <0.005 |
| Lu | <0.005 | <0.005 | <0.005 |
| Hf | <0.01 | <0.01 | 0.01 |
| Ta | Matrix | Matrix | Matrix |
| W | 2.1 | 2.1 | 0.23 |
| Re | 0.03 | 0.02 | <0.01 |
| Os | <0.005 | <0.005 | <0.005 |
| Ir | <0.01 | <0.01 | <0.01 |
| Pt | <0.05 | <0.05 | <0.05 |
| Au | <0.1 | <0.1 | <0.1 |
| Hg | <0.05 | <0.05 | <0.05 |
| Tl | <0.005 | <0.005 | <0.005 |
| Pb | <0.005 | <0.005 | <0.005 |
| Bi | <0.005 | <0.005 | <0.005 |
| Th | <0.001 | <0.001 | <0.001 |
| U | <0.001 | <0.001 | <0.001 |
| Total Content impurity | 21.517 | 19.942 | 71.769 |

From the last row of the table it is clear laser processing has reduced the total nongaseous impurity content of the tantalum by greater than a factor of three. For volatile elements such as Mg and Mn, the effect is even greater, approaching a factor of ten.

Grain structure and crystallographic texture were examined on a radial-axial section. Electron backscatter diffraction (EBSD) revealed a refined, somewhat columnar, grain structure. 100 was the predominant orientation, and the intensity of the 100 texture decreased with radius. In fact, the 100 intensity decreased from about 15× random at the center to about 3× random at the edge.

Evaluation of Ta thin films sputtered from the target showed a high degree of uniformity. Nominal 0.1 micron films were sputtered at 2, 5, 10, and 15 KWHRS of operation. The average geometric standard deviation of the film thicknesses (as measured by nine point resistivity tests) was 5.65%.

It will now be apparent to those skilled in the art that other embodiments, improvements, details, and uses can be made consistent with the letter and spirit of the foregoing disclosure and within the scope of this patent, which is limited only by the following claims, construed in accordance with the patent law, including the doctrine of equivalents.

What is claimed is:

1. A process for rejuvenating a refractory metal product having one or more consumed surface area portions comprising the steps of:
   a) filling said consumed portions with refractory metal powder particles, said powder being the same composition as said refractory metal product,
   b) simultaneously applying focused radiant energy to said powder in order to melt the powder, thereby causing particle to particle bonding and bonding of the particles to said consumed portions,
   c) discontinuing the filling step a) and the radiant energy applying step b) once said portions have been completely filled, and
   d) profiling the filled portions to the desired final shape
   wherein the focused radiant energy is applied via a laser to the powder as it fills the consumed portions of the refractory metal product so that it is molten as it contacts the consumed portions of the refractory metal product.

2. The process of claim 1, wherein said refractory metal product is a sputtering target.

3. The process of claim 1, wherein steps a) and b) are conducted continuously.

4. The process of claim 1, wherein said refractory metal is selected from the group consisting of tantalum, niobium, molybdenum and alloys thereof.

5. The process of claim 4, wherein said refractory metal is tantalum.

6. The process of claim 1, wherein said laser is a 1 to 3 KW laser.

7. A method to rejuvenate a consumed tantalum sputtering target comprising the steps:

provridng a used tantalum sputtering target having a tantalum sputtering plate and a backing plate, wherein a target face of said tantalum sputtering plate includes one or more consumed surface area portions;

providing a powder of tantalum;

selectively supplying a tantalum powder to partially or completely fill each of said one or more consumed surface area portions of the tantalum plate to form filled portions; and applying a short term, focused radiant energy locally to said filled portions to bond powder particles of said tantalum powder to each other and to said each of one or more consumed surface area portions to form a mass of bonded tantalum particles, whereby the energy beam being traced in a raster scan fashion over the consumed surface area portions, as the powder falls, to melt the powder particle surfaces and enable particle to particle bonding and bonding to the base of the consumed surface area continuously and repeatedly until it is filled and said used tantalum sputtering target is rejuvenated without separating said backing plate from said tantalum sputtering plate, wherein the focused radiant energy is applied to the powder as it fills the consumed portions of the refractory metal product so that it is molten as it contacts the consumed portions of the refractory metal product.

8. The method of rejuvenating a consumed tantalum sputtering as defined in claim 7 further comprising the step removing excess of said mass of bonded tantalum metal particles to level said tantalum sputtering plate.

9. The method of rejuvenating a consumed tantalum sputtering target as defined in claim 7 wherein said energy beam is laser beam, electron beam or the bonding step is plasma deposition.

10. The method of rejuvenating a consumed tantalum sputtering target as defined in claim 7 wherein said energy beam is applied in a vacuum environment.

11. The method of rejuvenating a consumed tantalum sputtering target as defined in claim 7 wherein said energy beam is applied in an inert gas environment.

12. The method of rejuvenating a consumed tantalum sputtering target as defined in claim 8 wherein the step removing excess of said mass of bonded metal particles to level the sputter plate is machining, sanding, abrasion etching or burn in sputtering.

13. The method as defined in claim 7, wherein the energy beam provides post-fill heating to complete a sintering step.

14. A process for rejuvenating a sputtering target having one or more consumed surface area portions comprising the steps of:

a) filling said consumed portions with refractory metal powder particles, said powder being the same composition as said refractory metal product, b) simultaneously applying focused radiant energy to said powder in order to melt the powder, thereby causing particle to particle bonding and bonding of the particles to said consumed portions, c) discontinuing the filling step a) and the radiant energy applying step b) once said portions have been completely filled, and d) profiling the filled portions to the desired final shape wherein the focused radiant energy is applied via a laser-to the powder as it fills the consumed portions of the sputtering target so that it is molten as it contacts the consumed portions of the sputtering target and wherein said refractory metal is selected from the group consisting of tantalum, niobium, molybdenum and alloys thereof.

15. The process of claim 14, wherein steps a) and b) are conducted continuously.

16. The process of claim 15, wherein said laser is a 1 to 3 KW laser.

* * * * *